United States Patent
Kanno et al.

(10) Patent No.: US 12,225,361 B2
(45) Date of Patent: Feb. 11, 2025

(54) SOUND SIGNAL PROCESSING DEVICE, SOUND SYSTEM, AND COMPUTER-IMPLEMENTED METHOD

(71) Applicant: YAMAHA CORPORATION, Hamamatsu (JP)

(72) Inventors: Toshifumi Kanno, Hamamatsu (JP); Nobuaki Tsuji, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 219 days.

(21) Appl. No.: 18/158,070

(22) Filed: Jan. 23, 2023

(65) Prior Publication Data
US 2023/0239619 A1    Jul. 27, 2023

(30) Foreign Application Priority Data
Jan. 26, 2022    (JP) .................. 2022-010046

(51) Int. Cl.
*H03G 5/00*    (2006.01)
*H03F 3/181*    (2006.01)
*H03F 3/189*    (2006.01)
*H04R 3/04*    (2006.01)

(52) U.S. Cl.
CPC .............. *H04R 3/04* (2013.01); *H03F 3/181* (2013.01); *H03F 3/189* (2013.01); *H03F 2200/03* (2013.01)

(58) Field of Classification Search
CPC ............ H04R 3/04; H03F 3/181; H03F 3/189
See application file for complete search history.

(56) References Cited

U.S. PATENT DOCUMENTS 9,674,609 B2 *   6/2017   Katayama ................ H04R 3/12
9,807,537 B2 *  10/2017   Yuyama .................. H04S 3/002
2010/0215192 A1 *  8/2010   Minnaar .................. H04R 3/04
                                                                    381/98

FOREIGN PATENT DOCUMENTS

JP             2012074780 A        4/2012

* cited by examiner

*Primary Examiner* — Simon King
(74) *Attorney, Agent, or Firm* — ROSSI, KIMMS & McDOWELL LLP

(57) ABSTRACT

A sound signal processing device supplies an output sound signal to an amplification device configured to supply a first sound signal to a high-frequency speaker and a low-frequency speaker. The sound signal processing device includes a high-pass filter, an amplitude limitation circuit, a low-pass filter, and a synthesis circuit. The high-pass filter removes a low-frequency component from an input sound signal to generate a high-frequency sound signal. The amplitude limitation circuit limits an amplitude of the input sound signal at or below a reference value to generate a second sound signal. The reference value corresponds to a clipping voltage of the amplification device. The low-pass filter removes a high-frequency component from the second sound signal to generate a low-frequency sound signal. The synthesis circuit synthesizes the high-frequency sound signal and the low-frequency sound signal to generate the output sound signal.

20 Claims, 7 Drawing Sheets

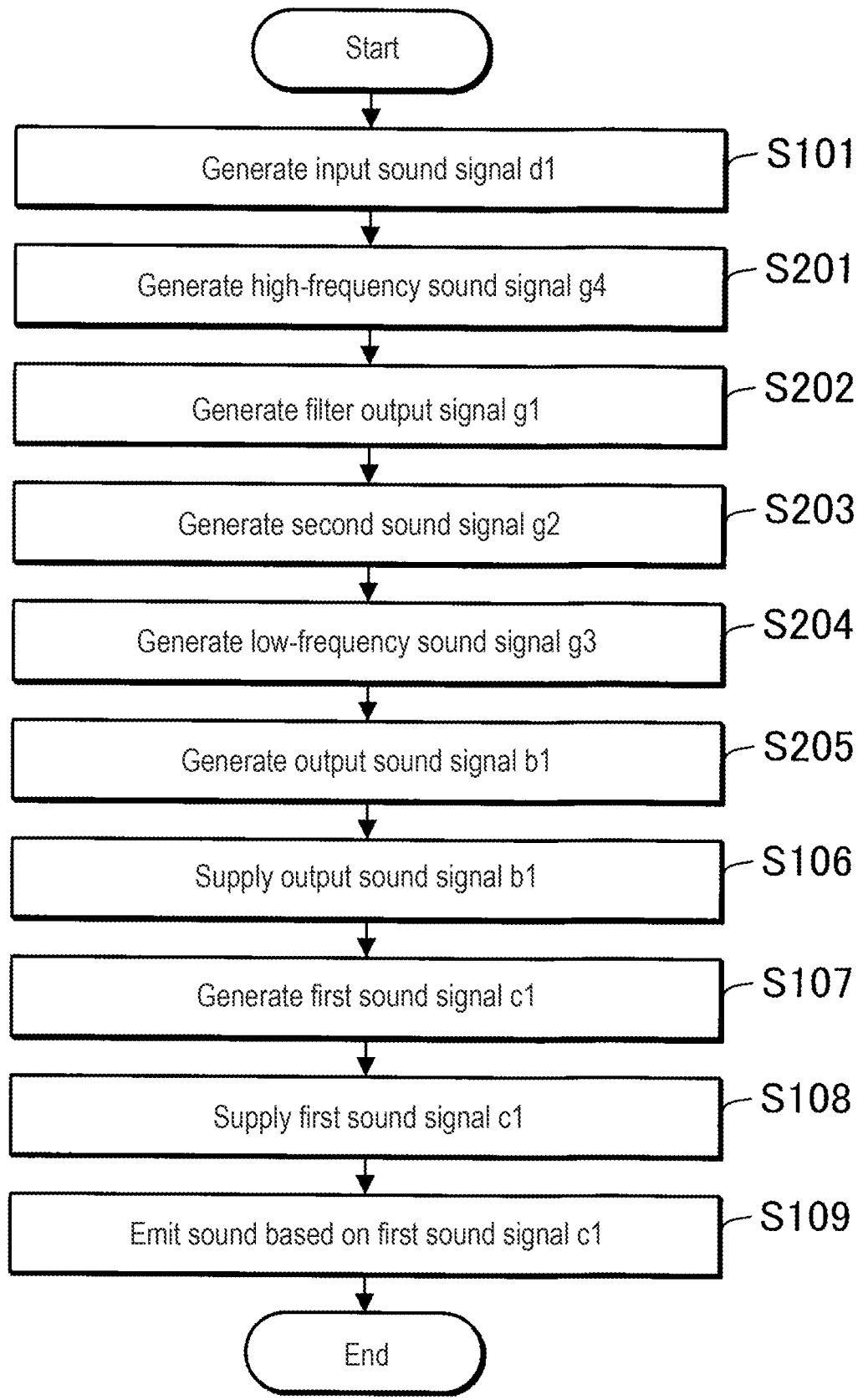

SOUND SIGNAL PROCESSING DEVICE, SOUND SYSTEM, AND COMPUTER-IMPLEMENTED METHOD

CROSS-REFERENCE TO RELATED APPLICATIONS

The present application claims priority under 35 U.S.C. § 119 to Japanese Patent Application No. 2022-010046, filed Jan. 26, 2022. The contents of this application are incorporated herein by reference in their entirety.

BACKGROUND

Field

The present disclosure relates to a sound signal processing device, a sound system, and a computer-implemented method.

Background Art

JP 2012-74780 A discloses a sound system in which one sound signal output from one amplification device is supplied to both a high-frequency speaker (tweeter) and a low-frequency speaker (woofer).

In a case where the sound system described in JP 2012-74780 A is mounted on a vehicle or the like, the power supply voltage of the amplification device cannot be increased, in some cases. For this reason, when a sound signal having large amplitude is supplied to the amplification device, the amplification device is likely to output a sound signal having a waveform clipped at the power supply voltage (clipping voltage). The clipped waveform includes a high-frequency component caused by clipping.

If such a high-frequency component caused by clipping is supplied from the amplification device to the high-frequency speaker, the high-frequency speaker will output noise caused by the high-frequency component.

One aspect of the present disclosure has an object to provide a technique capable of reducing a noise component included in output sound from a high-frequency speaker, in a situation in which a sound signal output from an amplification device is supplied to both the high-frequency speaker and a low-frequency speaker.

SUMMARY

One aspect is a sound signal processing device configured to supply an output sound signal to an amplification device configured to supply a first sound signal to a high-frequency speaker and a low-frequency speaker. The sound signal processing device includes a high-pass filter, an amplitude limitation circuit, a low-pass filter, and a synthesis circuit. The high-pass filter is configured to remove a low-frequency component from an input sound signal to generate a high-frequency sound signal. The amplitude limitation circuit is configured to limit an amplitude of the input sound signal at or below a reference value to generate a second sound signal. The reference value corresponds to a clipping voltage of the amplification device. The low-pass filter is configured to remove a high-frequency component from the second sound signal to generate a low-frequency sound signal. The synthesis circuit is configured to synthesize the high-frequency sound signal and the low-frequency sound signal to generate the output sound signal.

Another aspect is a sound system that includes the above-described sound signal processing device, the above-described high-frequency speaker, the above-described low-frequency speaker, and the above-described amplification device.

Another aspect is a sound signal processing device configured to supply an output sound signal to an amplification device configured to supply a first sound signal to a high-frequency speaker and a low-frequency speaker. The sound signal processing device includes a high-pass filter, a first low-pass filter, an amplitude limitation circuit, a second low-pass filter, and a synthesis circuit. The high-pass filter is configured to remove a low-frequency component from an input sound signal to generate a high-frequency sound signal. The first low-pass filter is configured to remove a high-frequency component from the input sound signal to generate a filter output signal. The amplitude limitation circuit is configured to limit an amplitude of the filter output signal at or below a reference value to generate a second sound signal. The reference value corresponds to a clipping voltage of the amplification device. The second low-pass filter is configured to remove a high-frequency component from the second sound signal to generate a low-frequency sound signal. The synthesis circuit is configured to synthesize the high-frequency sound signal and the low-frequency sound signal to generate the output sound signal.

Another aspect is a computer-implemented method of supplying an output sound signal to an amplification device configured to supply a first sound signal to a high-frequency speaker and a low-frequency speaker. The method includes removing a low-frequency component from an input sound signal to generate a high-frequency sound signal. The method also includes limiting an amplitude of the input sound signal at or below a reference value to generate a second sound signal. The reference value corresponds to a clipping voltage of the amplification device. The method also includes removing a high-frequency component from the second sound signal to generate a low-frequency sound signal. The method also includes synthesizing the high-frequency sound signal and the low-frequency sound signal to generate the output sound signal.

Another aspect is a computer-implemented method of supplying an output sound signal to an amplification device configured to supply a first sound signal to a high-frequency speaker and a low-frequency speaker. The method includes removing a low-frequency component from an input sound signal to generate a high-frequency sound signal. The method also includes removing a high-frequency component from the input sound signal to generate a filter output signal. The method also includes limiting an amplitude of the filter output signal at or below a reference value to generate a second sound signal. The reference value corresponds to a clipping voltage of the amplification device. The method also includes removing a high-frequency component from the second sound signal to generate a low-frequency sound signal. The method also includes synthesizing the high-frequency sound signal and the low-frequency sound signal to generate the output sound signal.

BRIEF DESCRIPTION OF THE DRAWINGS

A more complete appreciation of the present disclosure and many of the attendant advantages thereof will be readily obtained as the same becomes better understood by reference to the following detailed description when considered in connection with the following figures.

FIG. 7 is a flowchart illustrating an example of an operation of the sound system 1 in the first modification.

DESCRIPTION OF THE EMBODIMENTS

The present development is applicable to a sound signal processing device, a sound system, and a computer-implemented method.

A: First Embodiment

A1: Sound System 1

Figure 1:
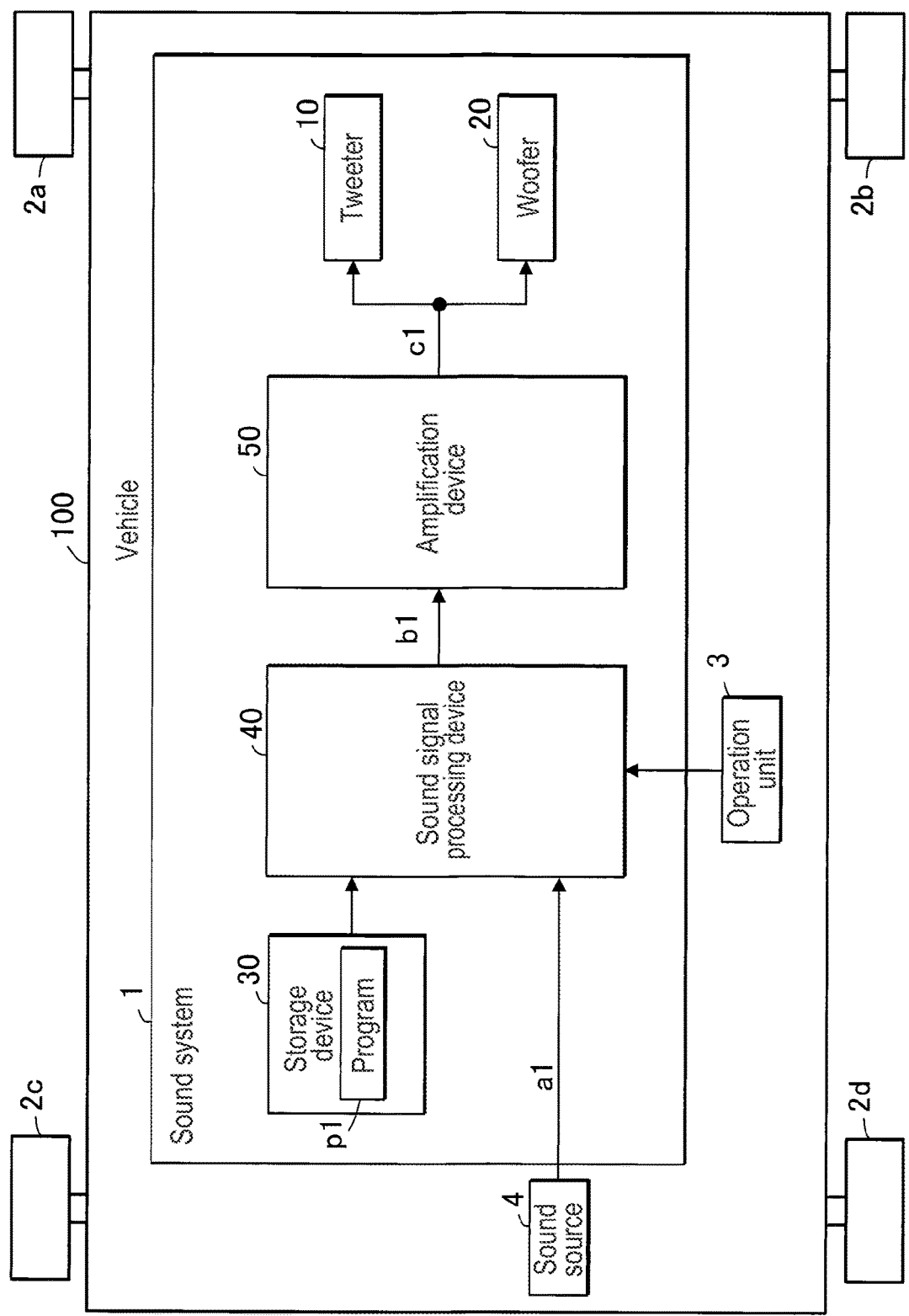
FIG. 1 is a diagram illustrating an example of a sound system 1 according to a first embodiment.

FIG. 1 is a diagram illustrating an example of the sound system 1 according to a first embodiment. The sound system 1 is a system in which a first sound signal c1 is supplied to both a tweeter 10 and a woofer 20. The first sound signal c1 is a signal indicating sound in a waveform. The sound system 1 is mounted on a vehicle 100 such as an automobile.

The vehicle 100 is driven by an occupant of the vehicle 100. The vehicle 100 may carry out automated driving without being driven by the occupant of the vehicle 100. The vehicle 100 includes the sound system 1, wheels 2a to 2d, an operation unit 3, and a sound source 4.

The wheels 2a and 2b are front wheels of the vehicle 100. The wheels 2c and 2d are rear wheels of the vehicle 100. In addition to the wheels 2a to 2d, the vehicle 100 may include an additional wheel.

The operation unit 3 is a touch panel. The operation unit 3 is not limited to the touch panel, and may be an operation panel including various operation buttons. The operation unit 3 receives an operation performed by the occupant of the vehicle 100. Hereinafter, an "occupant of the vehicle 100" will be referred to as a "user".

The sound source 4 generates a sound signal a1. The sound signal a1 is a signal indicating sound. The larger the amplitude of the sound signal a1, the greater the sound volume of the sound indicated by the sound signal a1.

The sound system 1 includes the tweeter 10, the woofer 20, a storage device 30, a sound signal processing device 40, and an amplification device 50. The storage device 30 may be an external element of the sound system 1.

The tweeter 10 is an example of a high-frequency speaker. The high frequency means high audio frequencies. The woofer 20 is an example of a low-frequency speaker. The low frequency means low audio frequencies. The tweeter 10 and the woofer 20 are located in the cabin of the vehicle 100. The crossover frequency between the tweeter 10 and the woofer 20 is 3 kHz. The crossover frequency between the tweeter 10 and the woofer 20 is not limited to 3 kHz, but may be, for example, higher than 3 kHz or lower than 3 kHz.

The storage device 30 is a computer-readable recording medium (for example, a non-transitory recording medium readable by a computer). The storage device 30 includes a non-volatile memory and a volatile memory. The non-volatile memory is, for example, a read only memory (ROM), an erasable programmable read only memory (EPROM), and an electrically erasable programmable read only memory (EEPROM). The volatile memory is, for example, a random access memory (RAM).

The storage device 30 stores a program p1. The program p1 determines operations of the sound signal processing device 40. The storage device 30 may store the program p1, which has been read from a storage device in a server, not illustrated. In this case, the storage device in the server is an example of a computer-readable recording medium.

The sound signal processing device 40 includes one or a plurality of central processing units (CPUs). One or the plurality of CPUs are examples of one or a plurality of processors. The sound signal processing device, the processor, and the CPU are each an example of a computer.

The sound signal processing device 40 reads the program p1 from the storage device 30. By executing the program p1, the sound signal processing device 40 implements various functions.

The sound signal processing device 40 generates an output sound signal b1 from the sound signal a1. The output sound signal b1 is a signal indicating sound in a waveform. The output sound signal b1 is a signal supplied to the amplification device 50.

The amplification device 50 amplifies the output sound signal b1, and generates the first sound signal c1. The amplification device 50 supplies the first sound signal c1 to the tweeter 10 and the woofer 20.

The amplification device 50 has a fixed gain (amplification factor). In a case where an amplified signal h1 obtained by amplifying the output sound signal b1 by the gain of the amplification device 50 exceeds clipping voltage of the amplification device 50, the amplification device 50 generates, as the first sound signal c1, a signal obtained by clipping the amplified signal h1 at the clipping voltage.

Figure 2:
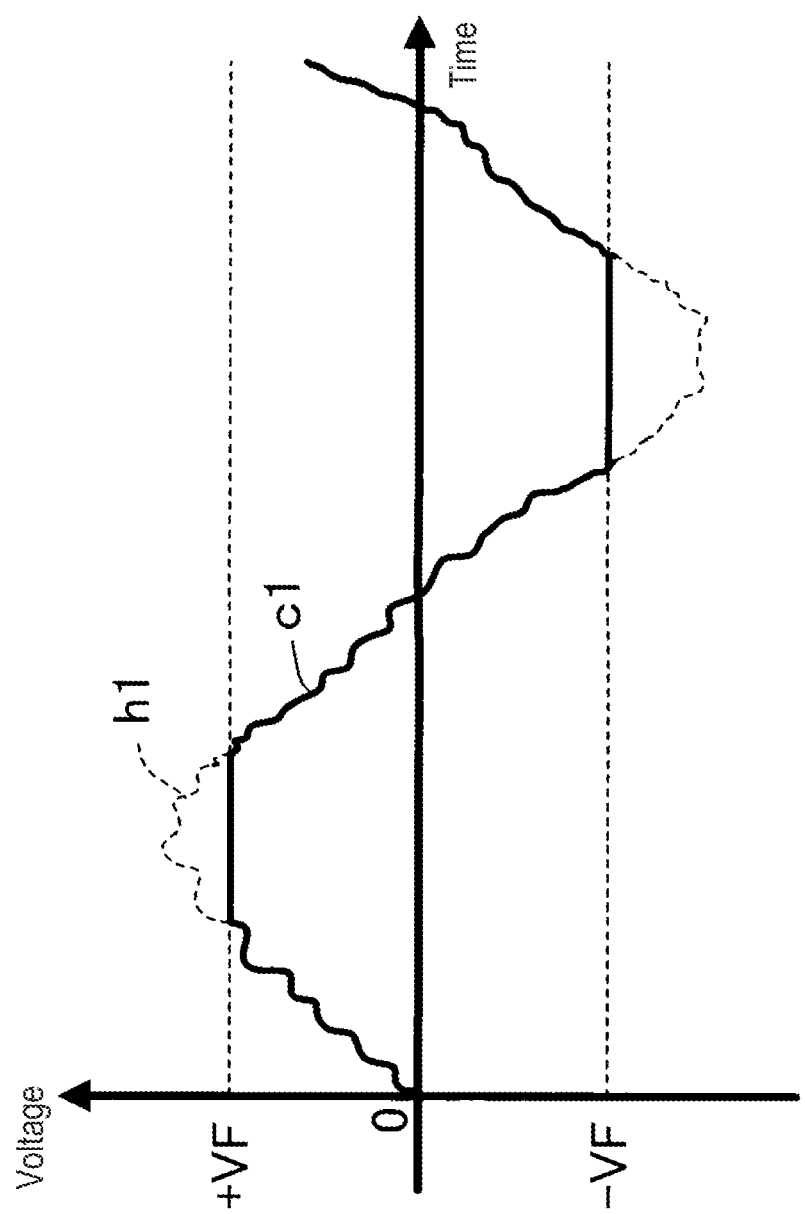
FIG. 2 is a graph illustrating an example of a first sound signal c1.

FIG. 2 is a graph illustrating an example of the first sound signal c1, which has been clipped. Voltage +Vf and voltage −Vf each serve as the clipping voltage. The situation in which the amplified signal h1 exceeds the clipping voltage includes a situation in which the amplified signal h1 is larger than the voltage +Vf and a situation in which the amplified signal h1 is smaller than the voltage −Vf.

The first sound signal c1, if it has been clipped, includes a harmonic of the first sound signal c1. The harmonic of the first sound signal c1 constitutes a high-frequency component. If the harmonic of the first sound signal c1 is supplied to the tweeter 10, the tweeter 10 will emit noise caused by the harmonic of the first sound signal c1.

The clipping voltage that affects the occurrence of noise depends on the power supply voltage of the amplification device 50. The power supply voltage of the amplification device 50 is supplied from the vehicle 100. For this reason, when the vehicle 100 is incapable of supplying a high power supply voltage to the amplification device 50, clipping that is the cause of noise is likely to occur in the amplification device 50.

The sound signal processing device 40 generates, as the output sound signal b1, a sound signal on which no clipping is to occur in the amplification device 50.

A2: Sound Signal Processing Device 40

Figure 3:
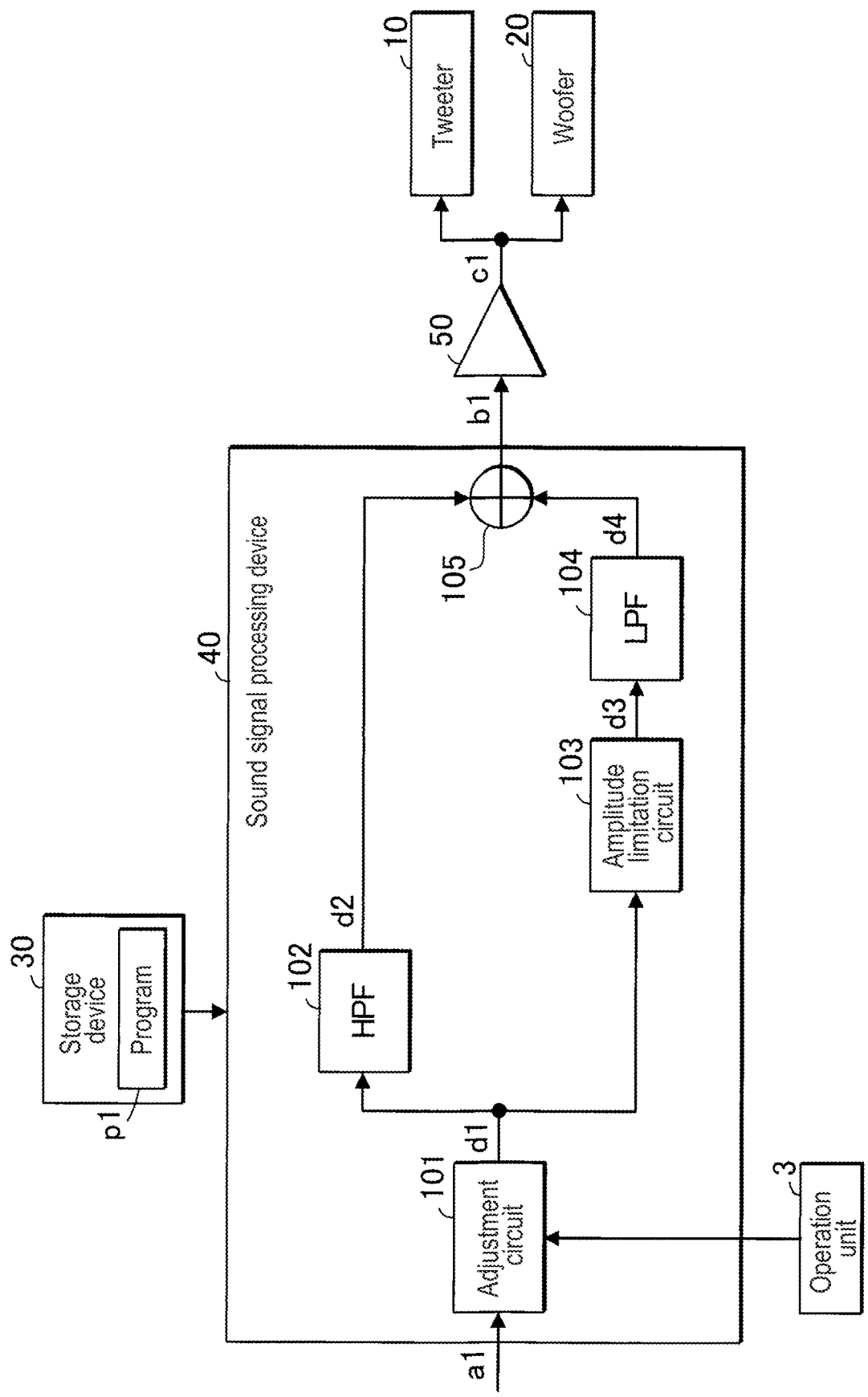
FIG. 3 is a diagram illustrating an example of a sound signal processing device 40.

FIG. 3 is a diagram illustrating an example of the sound signal processing device 40. By executing the program p1, the sound signal processing device 40 functions as an adjustment circuit 101, a high-pass filter (HPF) 102, an amplitude limitation circuit 103, a low-pass filter (LPF) 104, and a synthesis circuit 105. At least one of the adjustment circuit 101, the HPF 102, the amplitude limitation circuit 103, the LPF 104, and the synthesis circuit 105 may be configured with a circuit, such as a digital signal processor (DSP) and an application-specific integrated circuit (ASIC). The adjustment circuit 101 may be an external element of the sound signal processing device 40. The adjustment circuit 101 may be omitted.

The adjustment circuit 101 adjusts the amplitude of the sound signal a1, and generates an input sound signal d1. For example, the adjustment circuit 101 adjusts the amplitude of the sound signal a1 based on a volume operation of the user, and generates the input sound signal d1.

When the operation unit 3 receives an operation for increasing the sound volume from the user, the adjustment circuit 101 increases the amplitude of the sound signal a1. For example, in a case where the operation for increasing the sound volume is an operation for amplifying only a low sound component of the sound signal a1, the adjustment circuit 101 maintains the amplitude of a high sound component of the sound signal a1 while increasing the amplitude of the low sound component of the sound signal a1, and generates the input sound signal d1.

When the operation unit 3 receives an operation for reducing the sound volume from the user, the adjustment circuit 101 reduces the amplitude of the sound signal a1. For example, in a case where the operation for reducing the sound volume is an operation for reducing only the low sound component of the sound signal a1, the adjustment circuit 101 maintains the amplitude of the high sound component of the sound signal a1 while reducing the amplitude of the low sound component of the sound signal a1, and generates the input sound signal d1.

The adjustment circuit 101 may adjust the amplitude of the sound signal a1 in accordance with the state of the vehicle 100, and may generate the input sound signal d1. The state of the vehicle 100 is, for example, a speed state of the vehicle 100 or an acceleration state of the vehicle 100. For example, as the acceleration of the vehicle 100 increases, the adjustment circuit 101 increases the amplitude of the sound signal a1. As the speed of the vehicle 100 increases, the adjustment circuit 101 may increase the amplitude of the sound signal a1. When the amplitude of the sound signal a1 is not adjusted, the adjustment circuit 101 outputs the sound signal a1 as the input sound signal d1.

The input sound signal d1 includes a low-frequency component and a high-frequency component. The low-frequency component is a component having a frequency lower than the cutoff frequency of the HPF 102. The high-frequency component is a component having a frequency equal to or larger than the cutoff frequency of the LPF 104. The amplitude of a signal made up of the low-frequency component is larger than the amplitude of a signal made up of the high-frequency component.

The HPF 102 is a second-order infinite impulse response filter (IIR) filter. The HPF 102 is not limited to the second-order IIR filter, but may be, for example, a first-order IIR filter or a third-order IIR filter. The HPF 102 may be a digital filter, such as a finite impulse response (FIR) filter, which is different from the IIR filter.

The cutoff frequency of the HPF 102 is the same as the crossover frequency between the tweeter 10 and the woofer 20. The cutoff frequency of the HPF 102 may be different from the crossover frequency between the tweeter 10 and the woofer 20. For example, the cutoff frequency of the HPF 102 may be a frequency within the range of plus/minus E % of the crossover frequency between the tweeter 10 and the woofer 20. E % is, for example, 20%. E % is not limited to 20%, but may be, for example, a value smaller than 20% or a value larger than 20%.

The HPF 102 removes the low-frequency component from the input sound signal d1, and generates a high-frequency sound signal d2.

The amplitude limitation circuit 103 limits the amplitude of the input sound signal d1 at or below a reference value corresponding to the clipping voltage for clipping the first sound signal c1 to be output from the amplification device 50, and generates a second sound signal d3.

Figure 4:
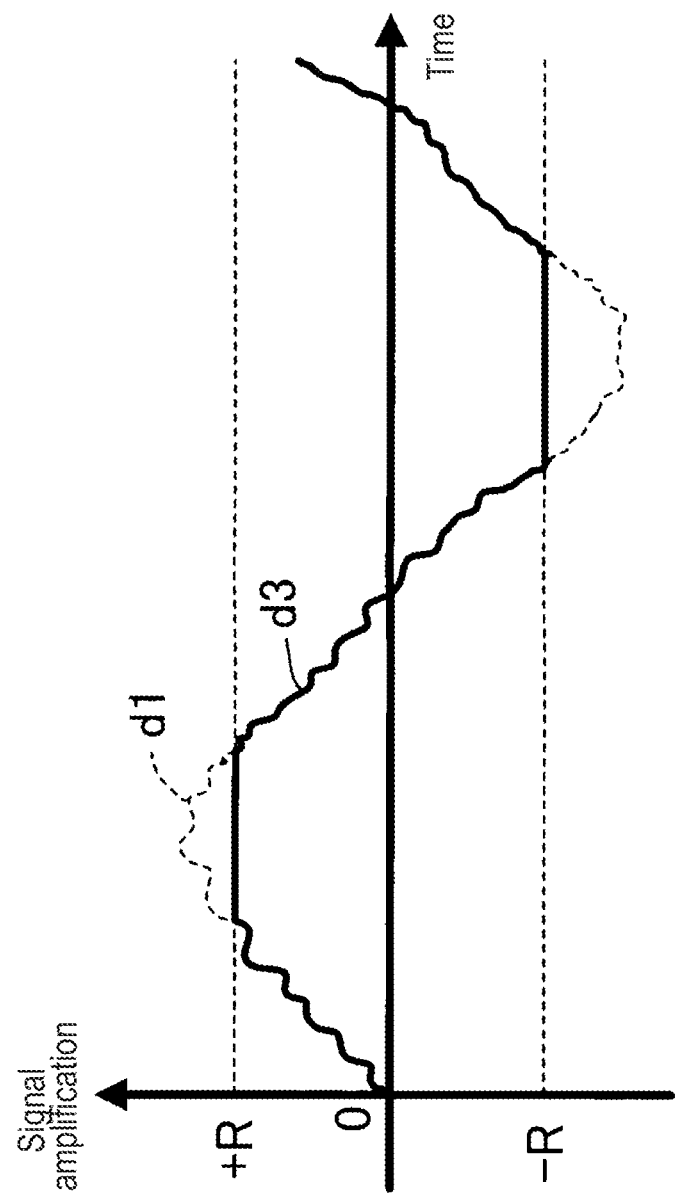
FIG. 4 is a graph illustrating an example of amplitude limitation performed by an amplitude limitation circuit 103.

FIG. 4 is a graph illustrating an example of amplitude limitation performed by the amplitude limitation circuit 103. Signal amplitude+R and signal amplitude −R each serve as the reference value.

When the viewpoint of the amplitude limitation circuit 103 illustrated in FIG. 3 is changed, the amplitude limitation circuit 103 limits the amplitude of the input sound signal d1 at or below the reference value, and thus prevents the first sound signal c1 from being clipped in the amplification device 50. That is, the amplitude limitation circuit 103 limits the amplitude of the input sound signal d1 at or below the reference value, and thus limits the voltage level of the output sound signal b1 to the voltage level for generating the first sound signal c1, which has not been clipped in the amplification device 50.

The voltage level on which the first sound signal c1 is not clipped in the amplification device 50 denotes a voltage level that does not exceed the clipping voltage of the amplification device 50. The voltage level on which no clipping occurs in the amplification device 50 is also represented as a voltage level that is different from the voltage level on which the first sound signal c1 is clipped in the amplification device 50.

The reference value is determined beforehand for the first sound signal c1 not to be clipped in the amplification device 50. It is to be noted that the amplitude of the output sound signal b1 increases in accordance with an increase in the reference value. The amplitude of the output sound signal b1 decreases in accordance with a decrease in the reference value.

The reference value is, for example, a value predetermined based on the clipping voltage of the amplification device 50 and the gain of the amplification device 50. The maximum amplitude of the signal is determined, based on the clipping voltage of the amplification device 50 and the gain of the amplification device 50 such that the first sound signal c1 is not clipped in the amplification device 50, even though it is input into the amplification device 50. For example, by dividing the clipping voltage of the amplification device 50 by the gain of the amplification device 50, the maximum amplitude of the signal is determined such that the first sound signal c1 is not clipped in the amplification device 50, even though it is input into the amplification device 50. Hereinafter, a "first maximum amplitude" will refer to the maximum amplitude of the signal, the first sound signal c1 is not clipped in the amplification device 50, even though it is input into the amplification device 50.

The reference value is, for example, a value for limiting the maximum amplitude of the output sound signal b1 to be smaller than the "first maximum amplitude". As an example, the reference value is a value for limiting the maximum amplitude of the output sound signal b1 to amplitude of F % of the "first maximum amplitude". F % is, for example, 80%. F % is not limited to 80%, may be a value smaller than 80% (for example, 70%), or may be larger than 80% (for example, 85%). For example, as the value obtained by dividing an estimated value of the amplitude of the high-frequency component in the input sound signal d1 by an estimated value of the amplitude of the low-frequency component in the input sound signal d1 increases, F % may be smaller. It is to be noted that the estimated value of the amplitude of the high-frequency component in the input sound signal d1 and the estimated value of the amplitude of the low-frequency component in the input sound signal d1 are predetermined, based on sampling of the input sound signal d1.

In addition, as will be described later, the high-frequency sound signal d2 generated by the HPF 102 and a low-frequency sound signal d4 generated by the LPF 104 are synthesized in the synthesis circuit 105, and thus the output sound signal b1 is generated. The high-frequency component is removed from the second sound signal d3, which has been generated by the amplitude limitation circuit 103, and thus the low-frequency sound signal d4 is generated.

Hence, for example, in a case where the gain of the LPF 104 and the gain of the synthesis circuit 105 are each "one time", the reference value may be a value for limiting the maximum amplitude of the output sound signal b1 to the amplitude obtained by subtracting the estimated value of the amplitude of the high-frequency sound signal d2 from the "first maximum amplitude". The estimated value of the amplitude of the high-frequency sound signal d2 is determined beforehand, based on sampling of the high-frequency sound signal d2.

The reference value is preset in the program p1. The amplitude limitation circuit 103 limits the amplitude of the input sound signal d1 at or below the preset reference value, and generates the second sound signal d3. In a case where the amplitude limitation circuit 103 limits the amplitude of the input sound signal d1, the first sound signal c1 is not clipped at the clipping voltage in the amplification device 50.

In the case where the amplitude limitation circuit 103 limits the amplitude of the input sound signal d1 and generates the second sound signal d3, the second sound signal d3 includes a harmonic associated with the amplitude limitation. The harmonic associated with the amplitude limitation in the amplitude limitation circuit 103 is a harmonic of the second sound signal d3. If the harmonic associated with the amplitude limitation in the amplitude limitation circuit 103 is supplied to the tweeter 10 via the amplification device 50, the tweeter 10 will output noise.

The LPF 104 removes the high-frequency component from the second sound signal d3, which has been generated by the amplitude limitation circuit 103, and generates the low-frequency sound signal d4. That is, the LPF 104 removes the harmonic associated with the amplitude limitation in the amplitude limitation circuit 103 from the second sound signal d3.

The LPF 104 is a second-order IIR filter. The LPF 104 is not limited to the second IIR filter, and may be, for example, a first-order IIR filter or a third-order IIR filter. The LPF 104 may be a digital filter, such as an FIR filter, which is different from an IIR filter.

The cutoff frequency of the LPF 104 is the same as the cutoff frequency of the HPF 102. The cutoff frequency of the LPF 104 is the same as the crossover frequency between the tweeter 10 and the woofer 20. The cutoff frequency of the LPF 104 may be different from the crossover frequency between the tweeter 10 and the woofer 20. For example, the cutoff frequency of the LPF 104 may be a frequency within a range of plus/minus E % (for example, 20%) of the crossover frequency between the tweeter 10 and the woofer 20.

The LPF 104 removes, from the second sound signal d3, not only the harmonic associated with the amplitude limitation in the amplitude limitation circuit 103 but also the high-frequency sound signal d2, which has been included in the input sound signal d1. With this configuration, the low-frequency sound signal d4 includes neither the harmonic associated with the amplitude limitation in the amplitude limitation circuit 103 nor the high-frequency sound signal d2, which has been included in the input sound signal d1.

The synthesis circuit 105 synthesizes the high-frequency sound signal d2, which has been generated by the HPF 102, and the low-frequency sound signal d4, which has been generated by the LPF 104, and generates the output sound signal b1. That is, the synthesis circuit 105 adds the high-frequency sound signal d2, which is not included in the low-frequency sound signal d4, to the low-frequency sound signal d4, and generates the output sound signal b1. Thus, the output sound signal b1 includes the high-frequency sound signal d2, which has been removed by the LPF 104. Furthermore, the output sound signal b1 is a signal having a voltage level for generating the first sound signal c1, which has not been clipped in the amplification device 50. The synthesis circuit 105 supplies the output sound signal b1 to the amplification device 50.

The amplification device 50 amplifies the output sound signal b1, and generates the first sound signal c1. In a situation in which the amplification device 50 amplifies the output sound signal b1, no clipping occurs in the amplification device 50. With this configuration, no harmonic associated with clipping is generated in the amplification device 50. Therefore, the first sound signal c1 does not include the harmonic associated with clipping. The amplification device 50 supplies the first sound signal c1 to both the tweeter 10 and the woofer 20.

The tweeter 10 emits sound corresponding to components of high audio frequencies of the first sound signal c1. Since the first sound signal c1 does not include the harmonic associated with clipping, the tweeter 10 does not emit noise caused by the harmonic associated with clipping. This configuration reduces the noise component included in the output sound from the tweeter 10. The woofer 20 emits sound corresponding to components of the low audio frequencies of the first sound signal c1.

A3: Description of Operation

Figure 5:
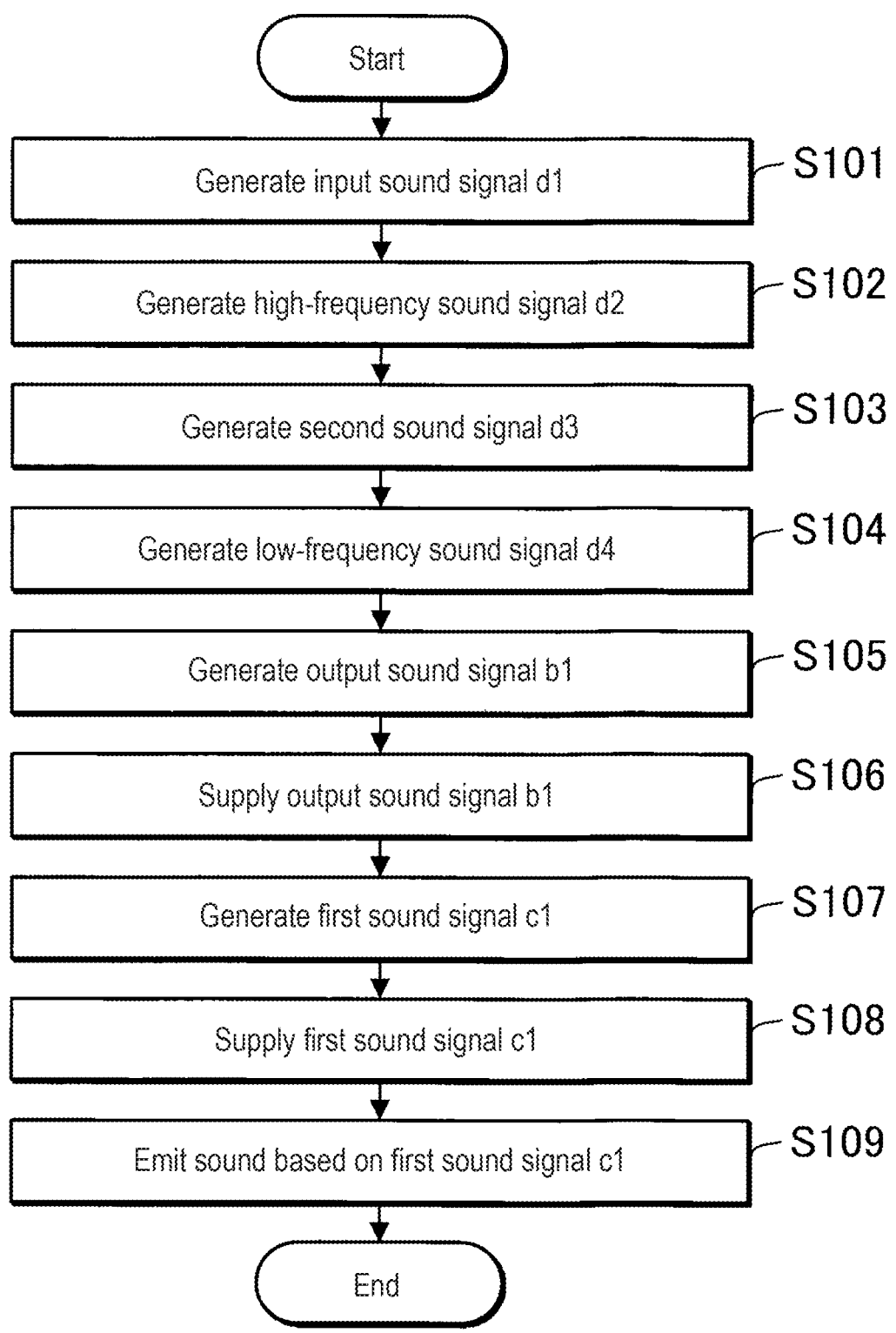
FIG. 5 is a flowchart illustrating an example of an operation of the sound system 1.

FIG. 5 is a flowchart illustrating an example of an operation of the sound system 1.

In step S101, the adjustment circuit 101 adjusts the amplitude of the sound signal a1 in accordance with an operation of the user, and generates the input sound signal d1.

Subsequently, in step S102, the HPF 102 removes the low-frequency component from the input sound signal d1, and generates the high-frequency sound signal d2. It is to be noted that step S102 may be performed between step S103 to be described later and step S105 to be described later.

Subsequently, in step S103, the amplitude limitation circuit 103 limits the amplitude of the input sound signal d1 at or below the reference value, and generates the second sound signal d3. The second sound signal d3 generated by the amplitude limitation circuit 103 includes the harmonic associated with the amplitude limitation in the amplitude limitation circuit 103.

Subsequently, in step S104, the LPF 104 removes the high-frequency component from the second sound signal d3, and generates the low-frequency sound signal d4. The low-frequency sound signal d4 includes neither the harmonic associated with the amplitude limitation in the amplitude limitation circuit 103 nor the high-frequency sound signal d2, which has been included in the input sound signal d1.

Subsequently, in step S105, the synthesis circuit 105 synthesizes the high-frequency sound signal d2, which has been generated by the HPF 102, and the low-frequency sound signal d4, which has been generated by the LPF 104, and generates the output sound signal b1. With this configuration, the output sound signal b1 includes the high-frequency sound signal d2, which has been removed by the LPF 104. In addition, the output sound signal b1 has a voltage level at which no clipping occurs in the amplification device 50.

Subsequently, in step S106, the synthesis circuit 105 supplies the output sound signal b1 to the amplification device 50.

Subsequently, in step S107, the amplification device 50 amplifies the output sound signal b1, and generates the first sound signal c1. In the amplification device 50, the first sound signal c1 is not clipped. With this configuration, the first sound signal c1 does not include the harmonic associated with clipping.

Subsequently, in step S108, the amplification device 50 supplies the first sound signal c1 to both the tweeter 10 and the woofer 20.

Subsequently, in step S109, the tweeter 10 and the woofer 20 emit sound based on the first sound signal c1. The first sound signal c1 does not include the harmonic associated with clipping. With this configuration, the noise caused by the harmonic associated with clipping is not emitted from the tweeter 10. This configuration reduces the noise component included in the output sound from the tweeter 10.

A4: Summarization of First Embodiment

The amplitude limitation circuit 103 limits the amplitude of the input sound signal d1 at or below the reference value, and generates the second sound signal d3. The LPF 104 removes the harmonic caused by the amplitude limitation in the amplitude limitation circuit 103 and the high-frequency sound signal d2, which has been included in the input sound signal d1, from the second sound signal d3, which has been generated by the amplitude limitation circuit 103. The synthesis circuit 105 synthesizes the high-frequency sound signal d2, which has been generated by the HPF 102, and the low-frequency sound signal d4, which has been generated by the LPF 104, and generates the output sound signal b1. The amplification device 50 amplifies the output sound signal b1, and generates the first sound signal c1. The amplification device 50 supplies the first sound signal c1 to both the tweeter 10 and the woofer 20.

With this configuration, the noise included in the output sound from the tweeter 10 can be reduced, while the woofer 20 is outputting powerful sound.

The reference value used in the amplitude limitation circuit 103 is a value predetermined based on the clipping voltage of the amplification device 50 and the gain of the amplification device 50.

With this configuration, the noise included in the output sound from the tweeter 10 (noise caused by clipping) can be limited, while the woofer 20 is outputting powerful sound in accordance with amplification characteristics of the amplification device 50, such as the clipping voltage of the amplification device 50 and the gain of the amplification device 50.

The cutoff frequency of the HPF 102 is equal to the cutoff frequency of the LPF 104. With this configuration, the frequency component of the input sound signal d1 can be reflected on the frequency component of the output sound signal b1, as compared with a configuration in which the cutoff frequency of the HPF 102 is different from the cutoff frequency of the LPF 104.

The cutoff frequency of the HPF 102 and the cutoff frequency of the LPF 104 are not limited to 3 kHz, but may be, for example, higher than 3 kHz or lower than 3 kHz.

The cutoff frequency of the HPF 102 and the cutoff frequency of the LPF 104 may be different from each other. Also in this case, noise (noise caused by clipping) included in the output sound from the tweeter 10 can be reduced.

The order of the HPF 102 is equal to the order of the LPF 104. With this configuration, the phase characteristic of the high-frequency sound signal d2 to be input into the synthesis circuit 105 are aligned with the phase characteristic of the low-frequency sound signal d4 to be input into the synthesis circuit 105. Thus, the quality of the sound indicated by the output sound signal b1 is improved, as compared with a configuration in which the order of the HPF 102 does not match the order of the LPF 104.

The order of the HPF 102 and the order of the LPF 104 are not limited to the second order, but may be, for example, higher than the second order or lower than the second order.

The order of the HPF 102 and the order of the LPF 104 may be different from each other. Also in this case, noise (noise caused by clipping) included in the output sound from the tweeter 10 can be reduced.

The adjustment circuit 101 adjusts the amplitude of the sound signal a1 in accordance with the volume operation of the user, and generates the input sound signal d1. With this configuration, the volume operation of the user is reflected on the amplitude of the input sound signal d1, instead of being reflected on the gain of the amplification device 50. Thus, even when the amplitude of the input sound signal d1 increases in accordance with the volume operation of the user, the occurrence of clipping in the amplification device 50 can be suppressed. Therefore, the noise included in the output sound from the tweeter 10 (noise caused by clipping) can be reduced.

B: Modifications

Aspects of modifications in the first embodiment will be described in the following. Two or more aspects optionally selected from the following aspects may be appropriately combined within a range that does not contradict each other.

B1: First Modification

Figure 6:
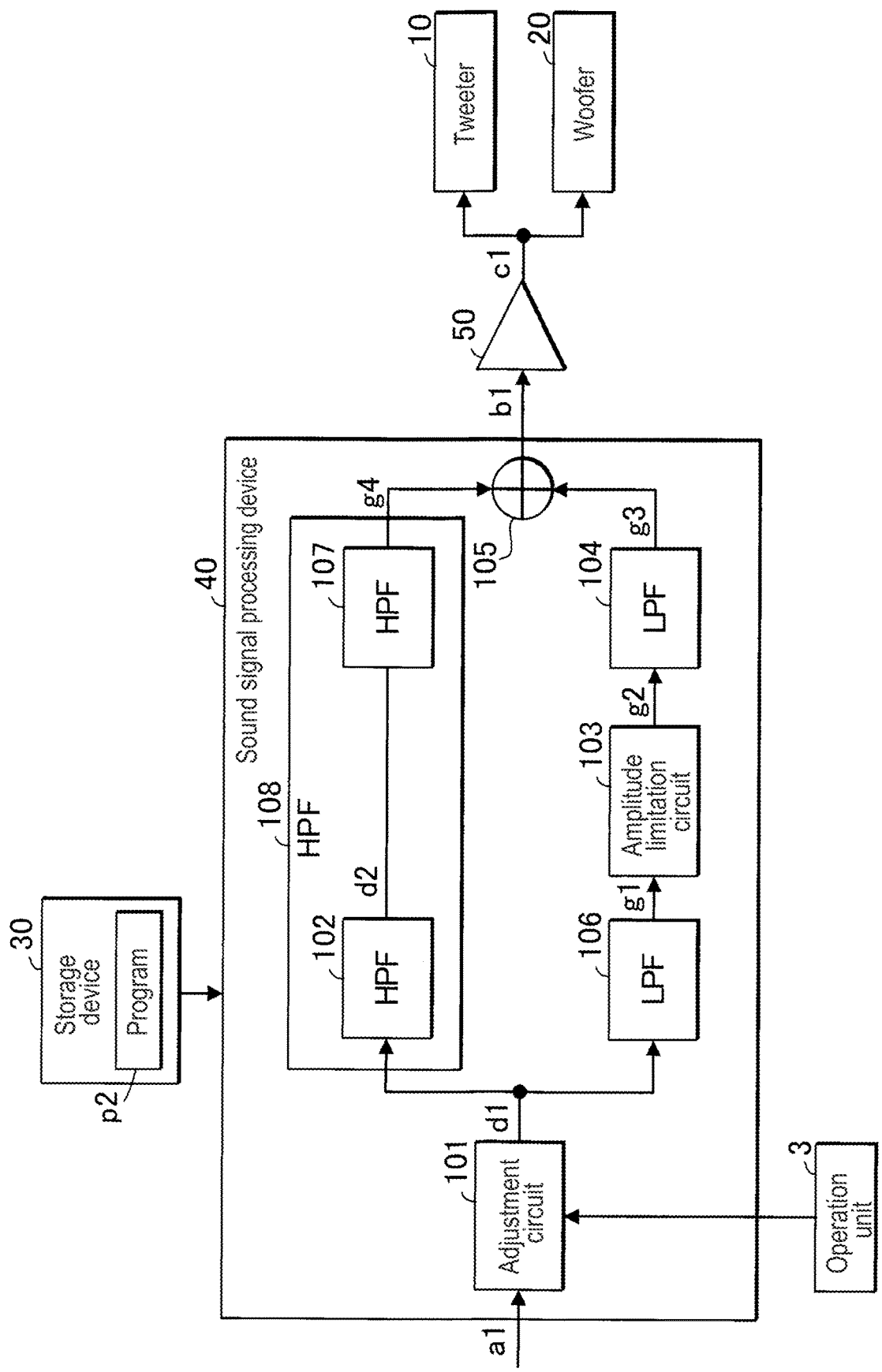
FIG. 6 is a diagram illustrating a first modification.

FIG. 6 is a diagram illustrating a first modification. Hereinafter, regarding the first modification, differences from the first embodiment will be mainly described. The first modification is different from the first embodiment in that, for example, an LPF 106 and an HPF 107 are included.

In the first modification, the storage device 30 stores a program p2 instead of the program p1. The sound signal processing device 40 reads the program p2 from the storage device 30. By executing the program p2, the sound signal processing device 40 functions as the adjustment circuit 101, the amplitude limitation circuit 103, the LPF 104, the synthesis circuit 105, the LPF 106, and the HPF 108. The HPF 108 includes the HPF 102 and the HPF 107. At least one of the adjustment circuit 101, the amplitude limitation circuit 103, the LPF 104, the synthesis circuit 105, the LPF 106, and the HPF 108 may be configured with a circuit such as a DSP and an ASIC.

The LPF 106 is an example of a first low-pass filter. The LPF 106 is a second-order IIR filter. The LPF 106 is not limited to the second-order IIR filter, but may be, for example, a first-order IIR filter or a third-order IIR filter. The LPF 106 may be a digital filter, such as an FIR filter, which is different from the IIR filter.

The cutoff frequency of the LPF 106 is the same as the cutoff frequency of the HPF 102 and the cutoff frequency of the LPF 104. The cutoff frequency of the LPF 106 is the same as the crossover frequency between the tweeter 10 and the woofer 20. The cutoff frequency of the LPF 106 may be different from the crossover frequency between the tweeter 10 and the woofer 20. For example, the cutoff frequency of the LPF 106 may be a frequency within a range of plus/minus E % (for example, 20%) of the crossover frequency between the tweeter 10 and the woofer 20.

The LPF 106 removes a high-frequency component from the input sound signal d1, and generates a filter output signal g1.

The amplitude limitation circuit 103 in the first modification limits the amplitude of the filter output signal g1 at or below the reference value corresponding to the clipping voltage for clipping the first sound signal c1 to be output from the amplification device 50, and generates a second sound signal g2. The second sound signal g2 includes a harmonic caused by the amplitude limitation in the amplitude limitation circuit 103. This harmonic is a harmonic of the second sound signal g2.

The LPF 104 in the first modification is an example of a second low-pass filter. The LPF 104 in the first modification removes a high-frequency component from the second sound signal g2, and generates a low-frequency sound signal g3. The low-frequency sound signal g3 is a signal in which the harmonic caused by the amplitude limitation in the amplitude limitation circuit 103 has been removed from the second sound signal g2. In addition, since the LPF 106 removes the high-frequency component from the input sound signal d1, the low-frequency sound signal g3 does not include the high-frequency sound signal d2, which is included in the input sound signal d1.

The HPF 107 is a second-order IIR filter. The HPF 107 is not limited to the second-order IIR filter, but may be, for example, a first-order IIR filter or a third-order IIR filter. The HPF 107 may be a digital filter, such as an FIR filter, which is different from the IIR filter.

The cutoff frequency of the HPF 107 is the same as the cutoff frequency of the HPF 102, the cutoff frequency of the LPF 104, and the cutoff frequency of the LPF 106. The cutoff frequency of the HPF 107 is the same as the crossover frequency between the tweeter 10 and the woofer 20. The cutoff frequency of the HPF 107 may be different from the crossover frequency between the tweeter 10 and the woofer 20. For example, the cutoff frequency of the HPF 107 may be a frequency within a range of plus/minus E % (for example, 20%) of the crossover frequency between the tweeter 10 and the woofer 20.

The HPF 107 removes a low-frequency component from the high-frequency sound signal d2, which has been generated by the HPF 102, and generates a high-frequency sound signal g4.

The HPF 108 includes the HPF 102 and the HPF 107. Hence, the cutoff frequency of the HPF 108 is the same as the cutoff frequency of the LPF 104 and the cutoff frequency of the LPF 106. Since the HPF 102 and the HPF 107 are each a second-order IIR filter, the order of the phase in the HPF 108 is the fourth order. The HPF 108 removes a low-frequency component from the input sound signal d1, and generates the high-frequency sound signal g4.

The synthesis circuit 105 in the first modification synthesizes the high-frequency sound signal g4, which has been generated by the HPF 108, and the low-frequency sound signal g3, which has been generated by the LPF 104, and generates the output sound signal b1. With this configuration, the output sound signal b1 includes the high-frequency sound signal g4, which has been removed by the LPF 106. Furthermore, the output sound signal b1 is a signal having a voltage level at which no clipping occurs in the amplification device 50. The synthesis circuit 105 supplies the output sound signal b1 to the amplification device 50.

FIG. 7 is a flowchart illustrating an example of an operation in the first modification. In FIG. 7, the same processes as those illustrated in FIG. 5 are denoted by the same reference numerals. Hereinafter, the processes different from those illustrated in FIG. 5 will be mainly described.

In step S201 that follows step S101, the HPF 108 removes the low-frequency component from the input sound signal d1, and generates the high-frequency sound signal g4. It is to be noted that step S201 may be performed between step S202 to be described later and step S205 to be described later.

Subsequently, in step S202, the LPF 106 removes the high-frequency component from the input sound signal d1, and generates the filter output signal g1.

Subsequently, in step S203, the amplitude limitation circuit 103 limits the amplitude of the filter output signal g1 at or below the reference value, and generates the second sound signal g2. The second sound signal g2 includes the harmonic associated with the amplitude limitation in the amplitude limitation circuit 103.

Subsequently, in step S204, the LPF 104 removes the high-frequency component from the second sound signal g2, and generates the low-frequency sound signal g3. The low-frequency sound signal g3 includes neither the harmonic associated with the amplitude limitation in the amplitude limitation circuit 103 nor the high-frequency sound signal g4 included in the input sound signal d1.

Subsequently, in step S205, the synthesis circuit 105 synthesizes the high-frequency sound signal g4, which has been generated by the HPF 108, and the low-frequency sound signal g3, which has been generated by the LPF 104, and generates the output sound signal b1. Then, steps S106 to S109 are performed.

According to the first modification, the noise included in the output sound from the tweeter 10 can be reduced, while the woofer 20 is outputting powerful sound, in a similar manner to the first embodiment. Furthermore, since the LPF 106 is included in the first modification, the quality of the output sound signal b1 is improved, as compared with a configuration in which the LPF 106 is not included.

The cutoff frequency of the HPF 108, the cutoff frequency of the LPF 104, and the cutoff frequency of the LPF 106 are equal to one another. With this configuration, the frequency component of the input sound signal d1 can be reflected on the frequency component of the output sound signal b1, as compared with a case where the cutoff frequency of the HPF 108, the cut-off frequency of the LPF 104, and the cutoff frequency of the LPF 106 are different from one another.

The cutoff frequency of the HPF 108, the cutoff frequency of the LPF 104, and the cutoff frequency of the LPF 106 are not limited to 3 kHz, but may be, for example, higher than 3 kHz or lower than 3 kHz.

The cutoff frequency of the HPF 108, the cutoff frequency of the LPF 104, and the cutoff frequency of the LPF 106 may be different from one another. Also in this case, noise (noise caused by clipping) included in the output sound from the tweeter 10 can be reduced.

The order of the HPF 108 is equal to the sum of the order of the LPF 104 and the order of the LPF 106. With this configuration, the phase characteristic of the high-frequency sound signal g4 to be input into the synthesis circuit 105 are aligned with the phase characteristic of the low-frequency sound signal g3 to be input into the synthesis circuit 105. Thus, the quality of the sound indicated by the output sound signal b1 is improved, as compared with a configuration in which the order of the HPF 108 does not match the sum of the order of the LPF 104 and the order of the LPF 106.

The order of the HPF 108, and the sum of the order of the LPF 104 and the order of the LPF 106 are not limited to the fourth order, but may be, for example, higher than the fourth order or lower than the fourth order.

The order of the HPF 108 may be different from the sum of the order of the LPF 104 and the order of the LPF 106. For example, the HPF 102 or the HPF 107 may be omitted. Also in this case, noise (noise caused by clipping) included in the output sound from the tweeter 10 can be reduced. In addition, in a case where the HPF 102 or the HPF 107 is omitted, the configuration can be simplified.

B2: Second Modification

In the first embodiment and the first modification, the gain of the amplification device 50 may be variable. In this case, the reference value may be changed, for example, in accordance with a change in the gain of the amplification device 50. For example, the reference value+R illustrated in FIG. 4 may be raised, and the reference valuer illustrated in FIG. 4 may be lowered in accordance with a decrease in the gain of the amplification device 50.

The reference value may be determined beforehand, based on the clipping voltage of the amplification device 50 and the maximum gain of the amplification device 50. For example, first, by dividing the clipping voltage of the amplification device 50 by the maximum gain of the amplification device 50, the maximum amplitude of the signal is determined such that the first sound signal c1 is not clipped in the amplification device 50, even though it is input into the amplification device 50. The reference value denotes a voltage that limits the maximum amplitude of the output sound signal b1 to the amplitude of F % of the maximum amplitude of the signal such that the first sound signal c1 is not clipped in the amplification device 50, even though it is input into the amplification device 50.

According to the second modification, even when the gain of the amplification device 50 is variable, while the woofer 20 is outputting powerful sound, the noise included in the output sound from the tweeter 10 can be reduced.

B3: Third Modification

In the first embodiment and the first and second modifications, the sound system 1 is not limited to being mounted on the vehicle 100, and may be mounted on a vehicle from which it can be difficult to supply high power supply voltage to the amplification device 50, unlike the vehicle 100. Examples of the vehicle from which it can be difficult to supply the high power supply voltage to the amplification device 50 include, for example, small airplanes or small boats.

According to the third modification, for example, in the small airplanes or the small boats, while the woofer 20 is outputting powerful sound, the noise included in the output sound from the tweeter 10 can be reduced.

C: Aspects Understood by the Above-described Embodiment and Modifications

The following aspects are understood from at least one of the above-described embodiment and modifications.

C1: First Aspect

A sound signal processing device according to an aspect (first aspect) of the present disclosure is a sound signal processing device configured to supply an output sound signal to an amplification device configured to supply a first sound signal to a high-frequency speaker and a low-frequency speaker. The sound signal processing device includes a high-pass filter, an amplitude limitation circuit, a low-pass filter, and a synthesis circuit. The high-pass filter is configured to remove a low-frequency component from an input sound signal to generate a high-frequency sound signal. The amplitude limitation circuit is configured to limit an amplitude of the input sound signal at or below a reference value to generate a second sound signal. The reference value corresponds to a clipping voltage of the amplification device. The low-pass filter is configured to remove a high-frequency component from the second sound signal to generate a low-frequency sound signal. The synthesis circuit is configured to synthesize the high-frequency sound signal and the low-frequency sound signal to generate the output sound signal.

According to this aspect, in a situation in which the first sound signal output from the amplification device is supplied to both the high-frequency speaker and the low-frequency speaker, a noise component included in the output sound from the high-frequency speaker can be reduced.

C2: Second Aspect

In an example (second aspect) of the first aspect, a cutoff frequency of the high-pass filter is equal to a cutoff frequency of the low-pass filter. According to this aspect, the frequency component of the input sound signal can be reflected on the frequency component of the output sound signal, as compared with a configuration in which the cutoff frequency of the high-pass filter is different from the cutoff frequency of the low-pass filter.

C3: Third Aspect

In an example (third aspect) of the first aspect or the second aspect, an order of the high-pass filter is equal to an order of the low-pass filter. According to this aspect, the phase characteristic of the high-frequency sound signal to be input into the synthesis circuit are aligned with the phase characteristic of the low-frequency sound signal to be input into the synthesis circuit. Thus, the quality of the sound indicated by the output sound signal is improved, as compared with a configuration in which the order of the high-pass filter does not match the order of the low-pass filter.

C4: Fourth Aspect

A sound signal processing device according to an aspect (fourth aspect) of the present disclosure is a sound signal processing device configured to supply an output sound signal to an amplification device configured to supply a first sound signal to a high-frequency speaker and a low-frequency speaker. The sound signal processing device includes a high-pass filter, a first low-pass filter, an amplitude limitation circuit, a second low-pass filter, and a synthesis circuit. The high-pass filter is configured to remove a low-frequency component from an input sound signal to generate a high-frequency sound signal. The first low-pass filter is configured to remove a high-frequency component from the input sound signal to generate a filter output signal. The amplitude limitation circuit is configured to limit an amplitude of the filter output signal at or below a reference value to generate a second sound signal. The reference value corresponds to a clipping voltage of the amplification device. The second low-pass filter is configured to remove a high-frequency component from the second sound signal to generate a low-frequency sound signal. The synthesis circuit is configured to synthesize the high-frequency sound signal and the low-frequency sound signal to generate the output sound signal.

According to this aspect, in a situation in which the first sound signal output from the amplification device is supplied to both the high-frequency speaker and the low-frequency speaker, the noise component included in the output sound from the high-frequency speaker can be reduced. In addition, in this aspect, since the first low-pass filter is included, the quality of the output sound signal can be improved, as compared with a configuration in which the first low-pass filter is not included.

C5: Fifth Aspect

In an example (fifth aspect) of the fourth aspect, a cutoff frequency of the high-pass filter, a cutoff frequency of the first low-pass filter, and a cutoff frequency of the second low-pass filter are equal to one another. According to this aspect, the frequency component of the input sound signal can be reflected on the frequency component of the output sound signal, as compared with a configuration in which the cutoff frequency of the high-pass filter, the cutoff frequency of the first low-pass filter, and the cutoff frequency of the second low-pass filter are different from one another.

C6: Sixth Aspect

In an example (sixth aspect) of the fourth aspect or the fifth aspect, an order of the high-pass filter is equal to a sum of an order of the first low-pass filter and an order of the second low-pass filter. According to this aspect, the phase characteristic of the high-frequency sound signal input into the synthesis circuit are aligned with the phase characteristic of the low-frequency sound signal input into the synthesis circuit. Thus, the quality of the sound indicated by the output sound signal is improved, as compared with a configuration in which the order of the high-pass filter does not match the sum of the order of the first low-pass filter and the order of the second low-pass filter.

C7: Seventh Aspect

In an example (seventh aspect) of one of the first aspect to the sixth aspect, the reference value is a value predetermined based on the clipping voltage of the amplification device and a gain of the amplification device. According to this aspect, the generation of noise included in the output sound from the high-frequency speaker can be limited, while the low-frequency speaker is outputting powerful sound, in accordance with the amplification characteristics of the amplification device such as the clipping voltage of the amplification device and the gain of the amplification device.

C8: Eighth Aspect

In an example (eighth aspect) of one of the first aspect to the seventh aspect, an adjustment circuit configured to adjust amplitude of a sound signal based on a volume operation performed by a user to generate the input sound signal is further included, and the high-frequency speaker and the low-frequency speaker are located in a vehicle. According to this aspect, the volume operation of the user is reflected on the amplitude of the input sound signal, instead of being reflected on the gain of the amplification device. Thus, even when the amplitude of the input sound signal increases in accordance with the volume operation of the user, the occurrence of clipping in the amplification device can be suppressed. Therefore, in the vehicle, noise included in the output sound from the high-frequency speaker can be reduced.

C9: Ninth Aspect

A sound system according to an aspect (ninth aspect) of the present disclosure includes the sound signal processing device of one of the first aspect to the eighth aspect, the high-frequency speaker, the low-frequency speaker, and the amplification device. According to this aspect, in a situation in which the first sound signal output from the amplification device is supplied to both the high-frequency speaker and the low-frequency speaker, the noise component included in the output sound from the high-frequency speaker can be reduced.

C10: Tenth Aspect

A computer-implemented method according to an aspect (tenth aspect) of the present disclosure is a computer-implemented method of supplying an output sound signal to an amplification device configured to supply a first sound signal to a high-frequency speaker and a low-frequency speaker. The method includes removing a low-frequency component from an input sound signal to generate a high-frequency sound signal. The method also includes limiting an amplitude of the input sound signal at or below a reference value to generate a second sound signal. The reference value corresponds to a clipping voltage of the amplification device. The method also includes removing a high-frequency component from the second sound signal to generate a low-frequency sound signal. The method also includes synthesizing the high-frequency sound signal and the low-frequency sound signal to generate the output sound signal.

According to this aspect, in a situation in which the first sound signal output from the amplification device is supplied to both the high-frequency speaker and the low-frequency speaker, the noise component included in the output sound from the high-frequency speaker can be reduced.

C11: Eleventh Aspect

A computer-implemented method according to an aspect (eleventh aspect) of the present disclosure is a computer-implemented method of supplying an output sound signal to an amplification device configured to supply a first sound signal to a high-frequency speaker and a low-frequency speaker. The method includes removing a low-frequency component from an input sound signal to generate a high-frequency sound signal. The method also includes removing a high-frequency component from the input sound signal to generate a filter output signal. The method also includes limiting an amplitude of the filter output signal at or below a reference value to generate a second sound signal. The reference value corresponds to a clipping voltage of the amplification device. The method also includes removing a high-frequency component from the second sound signal to generate a low-frequency sound signal. The method also includes synthesizing the high-frequency sound signal and the low-frequency sound signal to generate the output sound signal.

According to this aspect, in a situation in which the first sound signal output from the amplification device is supplied to both the high-frequency speaker and the low-frequency speaker, the noise component included in the output sound from the high-frequency speaker can be reduced.

While embodiments of the present disclosure have been described, the embodiments are intended as illustrative only and are not intended to limit the scope of the present disclosure. It will be understood that the present disclosure can be embodied in other forms without departing from the scope of the present disclosure, and that other omissions, substitutions, additions, and/or alterations can be made to the embodiments. Thus, these embodiments and modifications thereof are intended to be encompassed by the scope of the present disclosure. The scope of the present disclosure accordingly is to be defined as set forth in the appended claims.

What is claimed is:

1. A sound signal processing device configured to supply an output sound signal to an amplification device configured to supply a first sound signal to a high-frequency speaker and a low-frequency speaker, the sound signal processing device comprising:
   a high-pass filter configured to remove a low-frequency component from an input sound signal to generate a high-frequency sound signal;
   an amplitude limitation circuit configured to limit an amplitude of the input sound signal at or below a reference value to generate a second sound signal, the reference value corresponding to a clipping voltage of the amplification device;
   a low-pass filter configured to remove a high-frequency component from the second sound signal to generate a low-frequency sound signal; and
   a synthesis circuit configured to synthesize the high-frequency sound signal and the low-frequency sound signal to generate the output sound signal.

2. The sound signal processing device according to claim 1, wherein a cutoff frequency of the high-pass filter is equal to a cutoff frequency of the low-pass filter.

3. The sound signal processing device according to claim 2, wherein an order of the high-pass filter is equal to an order of the low-pass filter.

4. The sound signal processing device according to claim 3, wherein the reference value is determined based on the clipping voltage of the amplification device and a gain of the amplification device.

5. The sound signal processing device according to claim 2, wherein the reference value is determined based on the clipping voltage of the amplification device and a gain of the amplification device.

6. The sound signal processing device according to claim 2, further comprising an adjustment circuit configured to adjust an amplitude of a sound signal based on a volume operation performed by a user to generate the input sound signal,
   wherein the high-frequency speaker and the low-frequency speaker are located in a vehicle.

7. The sound signal processing device according to claim 1, wherein an order of the high-pass filter is equal to an order of the low-pass filter.

8. The sound signal processing device according to claim 7, wherein the reference value is determined based on the clipping voltage of the amplification device and a gain of the amplification device.

9. The sound signal processing device according to claim 7, further comprising an adjustment circuit configured to adjust an amplitude of a sound signal based on a volume operation performed by a user to generate the input sound signal,
   wherein the high-frequency speaker and the low-frequency speaker are located in a vehicle.

10. The sound signal processing device according to claim 1, wherein the reference value is determined based on the clipping voltage of the amplification device and a gain of the amplification device.

11. The sound signal processing device according to claim 10, wherein the reference value is determined based on the clipping voltage of the amplification device and a gain of the amplification device.

12. The sound signal processing device according to claim 1, further comprising an adjustment circuit configured to adjust an amplitude of a sound signal based on a volume operation performed by a user to generate the input sound signal,
    wherein the high-frequency speaker and the low-frequency speaker are located in a vehicle.

13. A sound system comprising:
    the sound signal processing device according to claim 1;
    the high-frequency speaker;
    the low-frequency speaker; and
    the amplification device.

14. A sound signal processing device configured to supply an output sound signal to an amplification device configured to supply a first sound signal to a high-frequency speaker and a low-frequency speaker, the sound signal processing device comprising:
    a high-pass filter configured to remove a low-frequency component from an input sound signal to generate a high-frequency sound signal;
    a first low-pass filter configured to remove a high-frequency component from the input sound signal to generate a filter output signal;
    an amplitude limitation circuit configured to limit an amplitude of the filter output signal at or below a reference value to generate a second sound signal, the reference value corresponding to a clipping voltage of the amplification device;

a second low-pass filter configured to remove a high-frequency component from the second sound signal to generate a low-frequency sound signal; and a synthesis circuit configured to synthesize the high-frequency sound signal and the low-frequency sound signal to generate the output sound signal.

15. The sound signal processing device according to claim 14, wherein a cutoff frequency of the high-pass filter, a cutoff frequency of the first low-pass filter, and a cutoff frequency of the second low-pass filter are equal to one another.

16. The sound signal processing device according to claim 15, wherein an order of the high-pass filter is equal to a sum of (i) an order of the first low-pass filter and (ii) an order of the second low-pass filter.

17. The sound signal processing device according to claim 14, wherein an order of the high-pass filter is equal to a sum of (i) an order of the first low-pass filter and (ii) an order of the second low-pass filter.

18. The sound signal processing device according to claim 14, wherein the reference value is determined based on the clipping voltage of the amplification device and a gain of the amplification device.

19. A computer-implemented method of supplying an output sound signal to an amplification device configured to supply a first sound signal to a high-frequency speaker and a low-frequency speaker, the method comprising:

removing a low-frequency component from an input sound signal to generate a high-frequency sound signal;

limiting an amplitude of the input sound signal at or below a reference value to generate a second sound signal, the reference value corresponding to a clipping voltage of the amplification device;

removing a high-frequency component from the second sound signal to generate a low-frequency sound signal; and synthesizing the high-frequency sound signal and the low-frequency sound signal to generate the output sound signal.

20. A computer-implemented method of supplying an output sound signal to an amplification device configured to supply a first sound signal to a high-frequency speaker and a low-frequency speaker, the method comprising:

removing a low-frequency component from an input sound signal to generate a high-frequency sound signal;

removing a high-frequency component from the input sound signal to generate a filter output signal;

limiting an amplitude of the filter output signal at or below a reference value to generate a second sound signal, the reference value corresponding to a clipping voltage of the amplification device;

removing a high-frequency component from the second sound signal to generate a low-frequency sound signal; and synthesizing the high-frequency sound signal and the low-frequency sound signal to generate the output sound signal.

* * * * *